(12) United States Patent
Shalvi et al.

(10) Patent No.: US 7,706,182 B2
(45) Date of Patent: Apr. 27, 2010

(54) ADAPTIVE PROGRAMMING OF ANALOG MEMORY CELLS USING STATISTICAL CHARACTERISTICS

(75) Inventors: Ofir Shalvi, Ra'anana (IL); Zeev Cohen, Zichron-Ya'akov (IL); Dotan Sokolov, Ra'anana (IL)

(73) Assignee: Anobit Technologies Ltd., Herzilia Pituach (IL)

( * ) Notice: Subject to any disclaimer, the term of this patent is extended or adjusted under 35 U.S.C. 154(b) by 236 days.

(21) Appl. No.: 11/949,135

(22) Filed: Dec. 3, 2007

(65) Prior Publication Data

US 2008/0130341 A1   Jun. 5, 2008

Related U.S. Application Data

(60) Provisional application No. 60/868,342, filed on Dec. 3, 2006.

(51) Int. Cl.
    *G11C 16/10* (2006.01)
(52) U.S. Cl. .............................. 365/185.03; 365/185.12; 365/185.11
(58) Field of Classification Search .................... 365/45, 365/185.03, 185.12, 185.11, 185.17, 185.33
    See application file for complete search history.

(56) References Cited

U.S. PATENT DOCUMENTS

| | | | |
|---|---|---|---|
| 4,993,029 A | 2/1991 | Galbraith et al. | |
| 5,191,584 A | 3/1993 | Anderson | |
| 5,742,752 A | 4/1998 | De Koning | |
| 5,761,402 A | 6/1998 | Kaneda et al. | |
| 6,040,993 A * | 3/2000 | Chen et al. | 365/185.03 |
| 6,141,261 A * | 10/2000 | Patti | 365/189.07 |
| 6,301,151 B1 | 10/2001 | Engh et al. | |
| 6,522,580 B2 | 2/2003 | Chen et al. | |
| 6,525,952 B2 * | 2/2003 | Araki et al. | 365/45 |
| 6,615,307 B1 | 9/2003 | Roohparvar | |

(Continued)

FOREIGN PATENT DOCUMENTS

EP   0783754 B1   7/1997

(Continued)

OTHER PUBLICATIONS

Perlmutter et al, U.S. Appl. No. 12/332,368 "Efficient Interference Cancellation in Analog Memory Cell Arrays" filed on Dec. 11, 2008.

(Continued)

*Primary Examiner*—Andrew Q Tran
(74) *Attorney, Agent, or Firm*—Darby & Darby P.C.

(57) ABSTRACT

A method for storing data in a memory that includes a plurality of analog memory cells includes mapping the data to programming values, which are selected from a set of nominal programming values. The set of nominal programming values includes at least a first nominal programming value and a second nominal programming value, which is higher than the first nominal programming value. A part of the data is stored in the analog memory cells by programming at least a first group of the cells using the first nominal programming value. A statistical characteristic of the first group of the cells is measured after programming the first group of the cells using the first nominal programming value. The second nominal programming value is modified responsively to the statistical characteristic, and at least a second group of the cells is programmed using the modified second nominal programming value.

25 Claims, 3 Drawing Sheets

U.S. PATENT DOCUMENTS

| | | | |
|---|---|---|---|
| 6,687,155 | B2 | 2/2004 | Nagasue |
| 7,130,210 | B2 | 10/2006 | Bathul et al. |
| 7,177,199 | B2 * | 2/2007 | Chen et al. ............. 365/185.28 |
| 7,409,473 | B2 | 8/2008 | Conley et al. |
| 7,570,520 | B2 * | 8/2009 | Kamei et al. ........... 365/185.19 |
| 7,593,259 | B2 | 9/2009 | Kim et al. |
| 2004/0057265 | A1 * | 3/2004 | Mirabel et al. ................. 365/45 |
| 2005/0007802 | A1 * | 1/2005 | Gerpheide .................... 365/45 |
| 2005/0240745 | A1 | 10/2005 | Iyer et al. |
| 2006/0179334 | A1 | 8/2006 | Brittain et al. |
| 2007/0019481 | A1 | 1/2007 | Park |
| 2007/0058446 | A1 | 3/2007 | Hwang et al. |
| 2007/0067667 | A1 | 3/2007 | Ikeuchi et al. |
| 2007/0159889 | A1 | 7/2007 | Kang et al. |
| 2007/0183210 | A1 | 8/2007 | Choi et al. |
| 2007/0271424 | A1 | 11/2007 | Lee et al. |
| 2008/0082730 | A1 | 4/2008 | Kim et al. |
| 2008/0215798 | A1 | 9/2008 | Sharon et al. |
| 2009/0172257 | A1 | 7/2009 | Prins et al. |
| 2009/0172261 | A1 | 7/2009 | Prins et al. |
| 2009/0204824 | A1 | 8/2009 | Lin et al. |
| 2009/0225595 | A1 | 9/2009 | Kim |

FOREIGN PATENT DOCUMENTS

| | | | |
|---|---|---|---|
| EP | 1434236 | B1 | 6/2004 |
| EP | 1605509 | A1 | 12/2005 |
| WO | 9610256 | A1 | 4/1996 |
| WO | 9828745 | A1 | 7/1998 |
| WO | 2007046084 | A2 | 4/2007 |
| WO | 2007132452 | | 11/2007 |
| WO | 2007132453 | A2 | 11/2007 |
| WO | 2007132456 | A2 | 11/2007 |
| WO | 2007132457 | A2 | 11/2007 |
| WO | 2007132458 | A2 | 11/2007 |
| WO | 2007146010 | A2 | 12/2007 |
| WO | 2008026203 | A2 | 3/2008 |
| WO | 2008053472 | | 5/2008 |
| WO | 2008053473 | A2 | 5/2008 |
| WO | 2008068747 | A2 | 6/2008 |
| WO | 2008077284 | A1 | 7/2008 |
| WO | 2008083131 | A2 | 7/2008 |
| WO | 2008099958 | A1 | 8/2008 |
| WO | 2008111058 | A2 | 9/2008 |
| WO | 2008124760 | A2 | 10/2008 |
| WO | 2008139441 | A2 | 11/2008 |
| WO | 2009037691 | A2 | 3/2009 |
| WO | 2009050703 | A2 | 4/2009 |

OTHER PUBLICATIONS

Agrell et al., "Closest Point Search in Lattices", IEEE Transactions on Information Theory, vol. 48, No. 8, pp. 2201-2214, Aug. 2002.

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.
International Application PCT/IL2007/000579 Search report dated Jul 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
International Application PCT/IL2008/001446 "Optimized selection of memory chips in multi-chip memory devices" filed on Nov. 4, 2008.
Shalvi et al., U.S. Appl. No. 12/251,471 "Compensation for Voltage Drifts in Analog Memory Cells" filed on Oct. 15, 2008.
Kasorla et al, U.S. Appl. No. 12/332,370 "Efficient Data Storage in Multi-Plane Memory Devices" filed on Dec. 11, 2008.
Sommer, N., U.S. Appl. No. 12/364,531 "Parameter Estimation Based on Error Correction Code Parity Check Equations" filed on Feb. 3, 2009.
Golov et al., U.S. Appl. No. 12/344,233 "Wear Level Estimation in Analog Memory Cells" filed on Dec. 25, 2008.
Perlmutter et al., U.S. Appl. No. 12/388,528 "Programming of Analog Memory Cells Using a Single Programming Pulse per State Transition" filed on Feb. 19, 2009.
Perlmutter et al., U.S. Appl. No. 12/390,522 "Programming Analog Memory Cells for Reduced Variance After Retention" filed on Feb. 23, 2009.
Perlmutter et al., U.S. Appl. No. 12/405,275 "Memory Device with Multiple-Accuracy Read Commands" filed on Mar. 17, 2009.
Perlmutter et al., U.S. Appl. No. 12/397,368 "Efficient Readout from Analog Memory Cells Using Data Compression" filed on Mar. 4, 2009.
Sommer, N., U.S. Appl. No. 12/171,797 "Memory Device with Non-Uniform Programming Levels" filed on Jul. 11, 2008.
U.S. Appl. No. 12/019,011 Official Action dated Nov. 20, 2009.

* cited by examiner

ADAPTIVE PROGRAMMING OF ANALOG MEMORY CELLS USING STATISTICAL CHARACTERISTICS

CROSS-REFERENCE TO RELATED APPLICATIONS

This application claims the benefit of U.S. Provisional Patent Application 60/868,342, filed Dec. 3, 2006, whose disclosure is incorporated herein by reference.

FIELD OF THE INVENTION

The present invention relates generally to memory devices, and particularly to methods and systems for programming analog memory cells.

BACKGROUND OF THE INVENTION

Several types of memory devices, such as Flash memories, use arrays of analog memory cells for storing data. Each analog memory cell stores a quantity of an analog value, such as an electrical charge or voltage, which represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Several methods and systems are known in the art for determining the voltages, which are used for programming analog memory cells. For example, U.S. Pat. No. 6,301,151, whose disclosure is incorporated herein by reference, describes a programming method in which the voltage of a programming pulse is adjusted based on the result of a previous pulse. The expected change in the programmed value of a cell is compared to the measured change, and the difference used to improve the model of the cell after each programming pulse. U.S. Patent Application Publication 2007/0058446, whose disclosure is incorporated herein by reference, describes methods for erasing and programming Flash memory devices, in which some of the cells are pre-programmed so as to reduce a voltage range in which threshold voltages are distributed.

U.S. Patent Application Publication 2007/0159889, whose disclosure is incorporated herein by reference, describes a method for programming a Flash memory device, which includes a plurality of memory cells for storing multi-bit data. Memory cells that are programmed within a predetermined region of a threshold voltage distribution are detected. The predetermined region is selected by one of a first verify voltage and a read voltage and a second voltage. The first verify voltage is lower than the second verify voltage and higher than the read voltage. The detected memory cells are programmed to have a threshold voltage that is equivalent to or higher than the second verify voltage corresponding to each of the states.

U.S. Pat. No. 7,130,210, whose disclosure is incorporated herein by reference, describes methods for programming a word line of multi-level Flash memory cells having three or more data levels per bit corresponding to three or more threshold voltages. An interactive programming algorithm programs the bits of the word line in two programming phases, a rough programming phase and a fine programming phase, so as to achieve compact threshold voltage distributions.

U.S. Patent Application Publication 2007/0183210, whose disclosure is incorporated herein by reference, describes a method for programming a Flash memory device, which includes a plurality of memory cells for storing multi-bit data indicating one of a plurality of states. The memory cells are subjected to a primary program operation. Those memory cells arranged within a specific region of respective states are subjected to a secondary program operation to have a threshold voltage equivalent to or higher than a verify voltage used in the primary program operation. Thus, although the threshold voltage distribution may be widened, a read margin between adjacent states may be sufficiently secured using the program method.

SUMMARY OF THE INVENTION

Embodiments of the present invention provide a method for storing data in a memory that includes a plurality of analog memory cells, including:

mapping the data to programming values selected from a set of nominal programming values including at least a first nominal programming value and a second nominal programming value, which is higher than the first nominal programming value;

storing a part of the data in the analog memory cells by programming at least a first group of the cells using the first nominal programming value;

measuring a statistical characteristic of the first group of the cells after programming the first group of the cells using the first nominal programming value;

modifying the second nominal programming value responsively to the statistical characteristic; and programming at least a second group of the cells using the modified second nominal programming value.

In some embodiments, measuring the statistical characteristic includes reading analog values from the first group of the cells and processing the read analog values to produce the statistical characteristic. The statistical characteristic may include at least one characteristic type selected from a group of types consisting of a mean of a distribution of the read analog values, a variance of the distribution of the read analog values, a standard deviation of the distribution of the read analog values, a maximum of the read analog values and a $k^{th}$-largest value among the read analog values.

In an embodiment, modifying the second nominal programming value includes measuring a distance between at least one of the read analog values and the second nominal programming value, and calculating the modified second nominal programming value responsively to the distance. Modifying the second nominal programming value may include increasing the second nominal programming value when the statistical characteristic indicates that the read analog values are widely-distributed around the first nominal programming value. Alternatively, modifying the second nominal programming value may include decreasing the second nominal programming value when the statistical characteristic indicates that the read analog values are closely concentrated around the first nominal programming value.

In some embodiments, the method includes reading the second group of the cells after programming the second group of the cells, so as to reconstruct the data. In an embodiment, modifying the second nominal programming value includes storing information regarding the modified second nominal programming value, and reading the second group of the cells includes retrieving the stored information regarding the modified second nominal programming value and reading the second group of the cells responsively to the retrieved information. In another embodiment, modifying the second nominal programming value includes reading respective analog values from the cells in the second group and processing the read analog values to estimate the modified second nominal programming value.

In yet another embodiment, measuring the statistical characteristic and modifying the second nominal programming value include classifying the analog memory cells to multiple classes, and measuring the statistical characteristic and modifying the second nominal programming value separately within each of the classes. The classes may include at least one class type selected from a group of types consisting of a row of the memory cells, a column of the memory cells, an odd-order column, an even-order column, a memory page, an erasure block, a memory plane, cells located near a boundary of a memory block and cells located in an interior of the memory block.

In some embodiment, the method includes designating an area of the memory as a calibration area, selecting the first group of the memory cells from the memory cells located in the calibration area, and selecting the second group of the memory cells from the memory cells located in another area of the memory different from the calibration area.

There is additionally provided, in accordance with an embodiment of the present invention, a data storage apparatus, including:

an interface, which is coupled to communicate with a memory that includes a plurality of analog memory cells; and a processor, which is coupled to map data to programming values selected from a set of nominal programming values including at least a first nominal programming value and a second nominal programming value that is higher than the first nominal programming value, to store a part of the data in the analog memory cells by programming at least a first group of the cells using the first nominal programming value, to measure a statistical characteristic of the first group of the cells after programming the first group of the cells using the first nominal programming value, to modify the second nominal programming value responsively to the statistical characteristic, and to program at least a second group of the cells using the modified second nominal programming value.

There is also provided, in accordance with an embodiment of the present invention, a data storage apparatus, including:

a memory, which includes a plurality of analog memory cells; and a processor, which is connected to the memory and is coupled to map data to programming values selected from a set of nominal programming values including at least a first nominal programming value and a second nominal programming value that is higher than the first nominal programming value, to store a part of the data in the analog memory cells by programming at least a first group of the cells using the first nominal programming value, to measure a statistical characteristic of the first group of the cells after programming the first group of the cells using the first nominal programming value, to modify the second nominal programming value responsively to the statistical characteristic, and to program at least a second group of the cells using the modified second nominal programming value.

The present invention will be more fully understood from the following detailed description of the embodiments thereof, taken together with the drawings in which:

DETAILED DESCRIPTION OF EMBODIMENTS

Overview

Data is commonly stored in analog memory cells by programming the cells using respective programming values, which are selected from a set of nominal values. Each nominal value corresponds to a certain memory state, also referred to as a level. For example, data can be stored in an array of eight-level (3 bits/cell) MLC by mapping groups of three bits to respective programming values, which are selected from a set of eight nominal values.

However, the analog values (e.g., threshold voltages) that are actually stored in the memory cells often deviate from the nominal values due to various distortion effects, inaccuracies in the programming process, or other reasons. The analog values stored in the cells are typically scattered around the nominal values in accordance with a certain statistical distribution.

Given a certain statistical distribution of analog values, the choice of nominal values that are used for programming the different levels has a considerable effect on the performance of the memory cell array. For example, nominal values that are too close to one another may increase the probability of read errors. On the other hand, nominal values that are unnecessarily distant from one another increase the dynamic range of analog values in the array, which in turn may cause more disturb noise, decrease programming speed and increase power consumption.

Embodiments of the present invention that are described hereinbelow provide methods and systems for selecting the nominal values used for programming the analog memory cells. In some embodiments, a Memory Signal Processor (MSP) stores data in an array of analog memory cells by programming the cells to one of a set of possible levels. The MSP sets the nominal value corresponding to a given level based on the statistical properties of analog memory cells, which are programmed to lower levels. (In the description that follows, a certain memory state or level is referred to as being lower than another level if its nominal value is lower than the nominal value of the other level.)

For example, the MSP may determine the nominal value of a certain level based on the threshold voltage statistics of the memory cells that are programmed to the next-lower level. Alternatively, the MSP may consider lower levels other than the next-lower level, as well. The MSP may use different statistical properties, such as the highest value in the distribution of the next-lower level, the $k^{th}$-highest value in the distribution, the variance or mean of the distribution, etc.

The term "nominal values," which refers to the values written to the memory cells, reflects the fact that these values are target values that the cells are intended to hold, but that the actual values stored in the cells often deviate statistically from the nominal values. The MSP may change the nominal values themselves from one cell group to another and/or over time, as will be shown below.

In some embodiments, the analog memory cells are divided into multiple subsets having similar statistical characteristics, and the MSP selects the nominal values separately within each subset. For example, the analog value distribution may be different in odd and even columns in the array, in different erasure blocks and/or in rows that are adjacent to the boundary of a memory block vs. rows located in the interior of the block. In some embodiments, a certain memory page may include cells that belong to more than one subset.

Using the methods described herein, the MSP can match the selection of nominal values to the actual analog value distribution in the array, to the actual observed distortion levels and/or to the expected performance level. When possible (e.g., when the analog value distribution has low variance or when distortion is low), the MSP may choose nominal values that are close to one another, thus increasing programming speed and reducing disturb noise effects. When distortion is high or when otherwise desired, the MSP may spread the nominal values over a wide range in order to achieve the expected error performance. Setting of the nominal values can be performed during production testing and/or during operation of the memory array in a host system.

System Description

Figure 1:
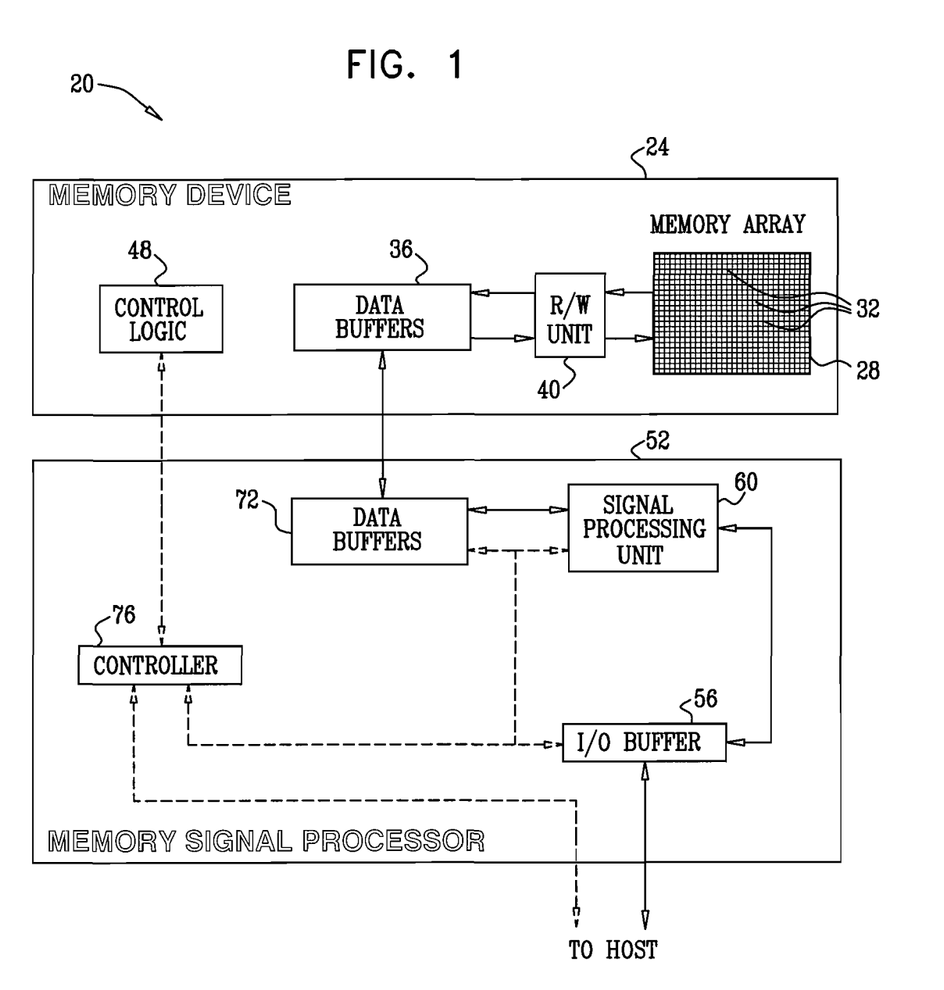
FIG. 1 is a block diagram that schematically illustrates a system for memory signal processing, in accordance with an embodiment of the present invention.

FIG. 1 is a block diagram that schematically illustrates a system 20 for memory signal processing, in accordance with an embodiment of the present invention. System 20 can be used in various host systems and devices, such as in computing devices, cellular phones or other communication terminals, removable memory modules ("disk-on-key" devices), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. The charge levels stored in the cells and/or the analog voltages or currents written into and read out of the cells are referred to herein collectively as analog values.

System 20 stores data in the analog memory cells by programming the cells to assume respective memory states, which are also referred to herein as levels. The memory states are selected from a finite set of possible states, and each state corresponds to a certain nominal analog value. For example, a 2 bit/cell MLC can be programmed to assume one of four possible memory states by writing one of four possible nominal analog values into the cell.

Data for storage in memory device 24 is provided to the device and cached in data buffers 36. The data is then converted to analog voltages and written into memory cells 32 using a reading/writing (R/W) unit 40, whose functionality is described in greater detail below. When reading data out of array 28, R/W unit 40 converts the electrical charge, and thus the analog voltages of memory cells 32, into digital samples having a resolution of one or more bits. The samples are cached in buffers 36. The operation and timing of memory device 24 is managed by control logic 48.

The storage and retrieval of data in and out of memory device 24 is performed by a Memory Signal Processor (MSP) 52. MSP 52 comprises a signal processing unit 60, which processes the data that is written into and read from device 24. In some embodiments, unit 60 encodes the data to be written into the memory cells using an Error Correction Code (ECC), and decodes the ECC of the retrieved data.

In particular, MSP 52 carries out novel methods for determining the nominal analog values that are used for programming the memory cells in array 28 to assume the different levels. The MSP calculates the nominal analog values based on characteristics (e.g., statistical properties) of memory cells in the array that are programmed to lower levels, as will be described in detail below.

MSP 52 comprises a data buffer 72, which is used by unit 60 for storing data and for interfacing with memory device 24. MSP 52 also comprises an Input/Output (I/O) buffer 56, which forms an interface between the MSP and the host system. A controller 76 manages the operation and timing of MSP 52. Signal processing unit 60 and controller 76 may be implemented in hardware. Alternatively, unit 60 and/or controller 76 may comprise microprocessors that run suitable software, or a combination of hardware and software elements.

The configuration of FIG. 1 is an exemplary system configuration, which is shown purely for the sake of conceptual clarity. Any other suitable configuration can also be used.

Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 52 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which memory array 28 is disposed. Further alternatively, some or all of the functionality of MSP 52 can be implemented in software and carried out by a processor or other element of the host system. In some implementations, a single MSP 52 may be connected to multiple memory devices 24.

In a typical writing operation, data to be written into memory device 24 is accepted from the host and cached in I/O buffer 56. The data is transferred, via data buffers 72, to memory device 24. The data may be pre-processed by MSP 52 before it is transferred to the memory device for programming. For example, unit 60 may encode the data using an ECC, add certain data for internal use, and/or scramble the data. In device 24 the data is temporarily stored in buffers 36. R/W unit 40 converts the data to nominal analog values and writes the nominal values into the appropriate cells 32 of array 28. In a typical reading operation, R/W unit 40 reads analog values out of the appropriate memory cells 32 and converts them to soft digital samples. The samples are cached in buffers 36 and transferred to buffers 72 of MSP 52. In some embodiments, unit 60 of MSP 52 converts the samples to data bits.

Figure 2:
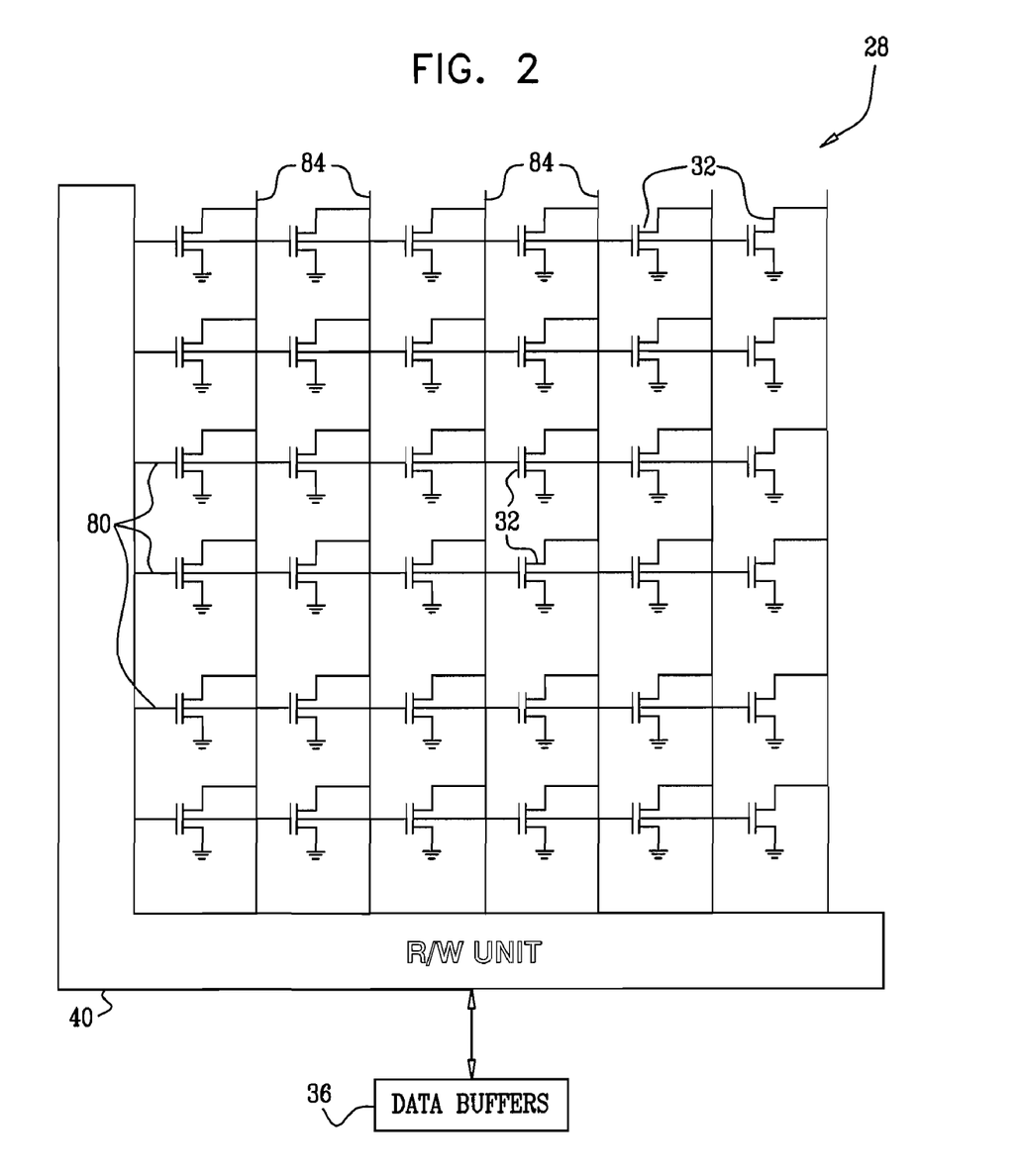
FIG. 2 is a diagram that schematically illustrates a memory cell array, in accordance with an embodiment of the present invention.

FIG. 2 is a diagram that schematically illustrates memory cell array 28, in accordance with an embodiment of the present invention. Although FIG. 2 refers to Flash memory cells that are connected in a particular array configuration, the principles of the present invention are applicable to other types of memory cells and other array configurations, as well. Some exemplary cell types and array configurations are described in the references cited in the Background section above.

Memory cells 32 of array 28 are arranged in a grid having multiple rows and columns. Each cell 32 comprises a floating gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is indicative of the charge stored in the cell.

In the exemplary configuration of FIG. 2, the gates of the transistors in each row are connected by word lines 80. The sources of the transistors in each column are connected by bit lines 84. In some embodiments, such as in some NOR cell devices, the sources are connected to the bit lines directly. In alternative embodiments, such as in some NAND cell devices, the bit lines are connected to strings of floating-gate cells.

Typically, R/W unit 40 reads the threshold voltage of a particular cell 32 by applying varying voltage levels to its gate (i.e., to the word line to which the cell is connected) and checking whether the drain current of the cell exceeds a certain threshold (i.e., whether the transistor conducts). Unit 40 usually applies a sequence of different voltage values to the word line to which the cell is connected, and determines the lowest gate voltage value for which the drain current exceeds the threshold. Typically, unit 40 reads a group of cells, referred to as a page, simultaneously. Alternatively, R/W unit may use any other technique or circuitry for reading and writing values to and from memory cells 32 of array 28.

The memory cell array is typically divided into multiple pages, i.e., groups of memory cells that are programmed and read simultaneously. In some embodiments, each page comprises an entire row of the array. In alternative embodiments, each row (word line) can be divided into two or more pages. For example, in some SLC devices each row is divided into two pages, one comprising the odd-order cells and the other comprising the even-order cells. Typically but not necessarily, a two-bit-per-cell memory device usually has four pages per row, a three-bit-per-cell memory device has six pages per row, and a four-bit-per-cell memory device has eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line is often partitioned into four pages (odd/even order cells, least/most significant bit of the cells). Three-bit-per cell devices often have 192 pages per erasure block, and four-bit-per-cell devices often have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

Figure 3:
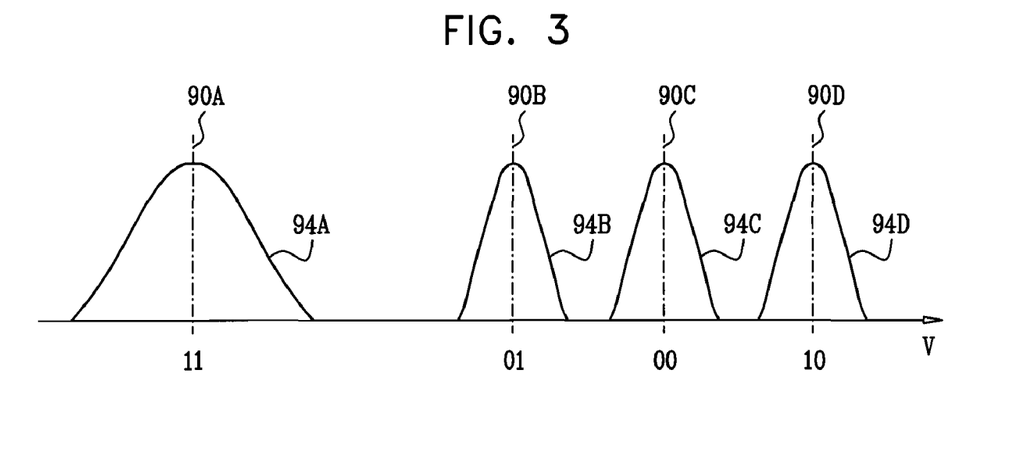
FIG. 3 is a diagram that schematically illustrates voltage distributions in a group of analog memory cells, in accordance with an embodiment of the present invention.

FIG. 3 is a diagram that schematically illustrates voltage distributions in a group of analog memory cells, in accordance with an embodiment of the present invention. In the present example, the analog memory cells comprise four-level MLC. The MSP stores two data bits in a certain cell by mapping the bit pair to a corresponding nominal value. The four-level configuration of FIG. 3 has four nominal values 90A . . . 90D, corresponding to "11", "01", "00" and "10" data, respectively.

Although the memory cells are programmed using four possible nominal values, the actual analog values (e.g., threshold voltages) stored in the cells may deviate from the nominal values for a variety of reasons. For example, the cells are usually programmed using an iterative Program and Verify (P&V) process, as is known in the art. Inaccuracies in the P&V process may cause statistical variations in the programmed analog values. Variations may also be caused by memory cell aging, which may cause the analog values to drift differently in different cells, as well as by various inter-cell interference mechanisms. In the present example, the memory cells programmed with nominal values 90A . . . 90D have analog values, which are scattered around the nominal values in accordance with distributions 94A . . . 94D, respectively.

The memory cell configuration shown in FIG. 3 is chosen purely for the sake of conceptual clarity. The methods and systems described herein can be used with memory cells that are programmed to assume any number of levels, including SLC.

Adaptive Programming Method

The selection of nominal values 90A . . . 90D has a considerable effect on the performance of the memory array. For example, spreading the nominal values over a wide range increases the magnitude of the analog values used in the array, which is often undesirable. A high analog value in a certain cell is more likely to cause disturb noise and other distortion in other cells. Moreover, using unnecessarily high analog values also increases the programming time of the cells, particularly when using P&V schemes. Higher analog values also increase the power consumption of the memory array.

On the other hand, nominal values that are too close to one another may degrade the error probability of the array. Given a certain analog value distribution, the probability of a read error typically increases as the separation between adjacent nominal values decreases. The optimal choice of nominal values may change over time, since the parameters that determine this trade-off (e.g., analog value distribution, distortion levels and data-dependent effects) are often dynamic.

Embodiments of the present invention provide methods and systems for automatic selection and adaptation of the nominal values used for programming analog memory cells. In these embodiments, MSP 52 sets the nominal value of a certain level based on a statistical characteristic of the lower levels.

Consider an m-level MLC array, whose cells can be programmed to one of m levels denoted $L1 \ldots Lm$. When storing data in this array, the cells are programmed to various levels. In particular, a subset of the cells are to be programmed to a level $Li$, $i \in \{1 \ldots m\}$. In order to determine the nominal value to be used for programming these cells, the MSP reads the analog values from a group of memory cells, which were already programmed to lower levels ($Lj$, $j<i$). The MSP determines a statistical characteristic of the analog values read from the lower-level cells, and calculates the nominal value corresponding to level $Li$ based on the statistical characteristic.

For example, referring to the four-level configuration of FIG. 3, the MSP may set the magnitude of nominal value 90C by (1) reading the analog values from a group of analog memory cells that were programmed to the next-lower level "01" level, (2) calculating a statistical characteristic of the read analog values, and (3) setting the magnitude of nominal value 90C based on the statistical characteristic.

The MSP may calculate the statistical characteristic over analog values belonging to the next-lower level, or to two or more lower levels. For example, the MSP may determine the magnitude of nominal value 90D based on the values read from cells belonging to distribution 94C, or based on cells belonging to any of distributions 90A . . . 90C.

The MSP may use various types of statistical characteristics of lower-level cells for determining the nominal value of a given level. For example, when determining the magnitude of nominal value 90C, the MSP may consider the highest analog value in distribution 94B, the $k^{th}$-highest analog value in distribution 94B, the mean, standard deviation or variance of this distribution, or any other suitable statistical characteristic.

Thus, for example, if distribution 94B is wide, the MSP can increase the magnitude of nominal value 90C, so as to increase the separation between distributions 94B and 94C and achieve adequate error performance. If, on the other hand, distribution 94B is compact around nominal value 90B, the MSP may reduce the magnitude of nominal value 90C.

The MSP may also assess the distance between one or more of the values of the lower-level distributions from the nominal value being adapted, and modify the nominal value based on this distance. In other words, if one or more of the values in the lower-level distributions is too close to the nominal value in question, the MSP may increase this nominal value in order to retain adequate error performance. If, on the other hand, all (or most) of the values in the lower-level distributions are distant from the nominal value in question, the MSP may decrease the nominal value.

The MSP may measure the statistical characteristics and/or modify the nominal values either during the normal operation of the memory device and MSP in the host system, and/or during production. In an exemplary process that can be carried out during production, the MSP first programs the memory cells in a given erasure block to the different levels using a predetermined initial set of nominal values. The MSP reads the analog values from the programmed cells and evaluates the statistical characteristic. For example, the MSP may evaluate the statistical distribution of analog values, such as the distribution shown in FIG. 3. Based on the statistical characteristic, the MSP modifies one or more of the nominal values. The MSP then erases the block and re-programs the cells using the modified nominal values. The MSP may verify the programmed values and, if not programmed correctly, repeat the process of reading the cells, evaluating the statistical characteristic and modifying the nominal values.

The calibration process described above may be applied to all erasure blocks of the memory, or only to some of the blocks. For example, when the properties of different blocks are sufficiently similar to one another, the MSP may define one or more blocks as calibration blocks, and apply the calibration process described above only to these blocks. The calibration results (modified nominal values) can be used when programming other blocks of the memory.

Figure 4:
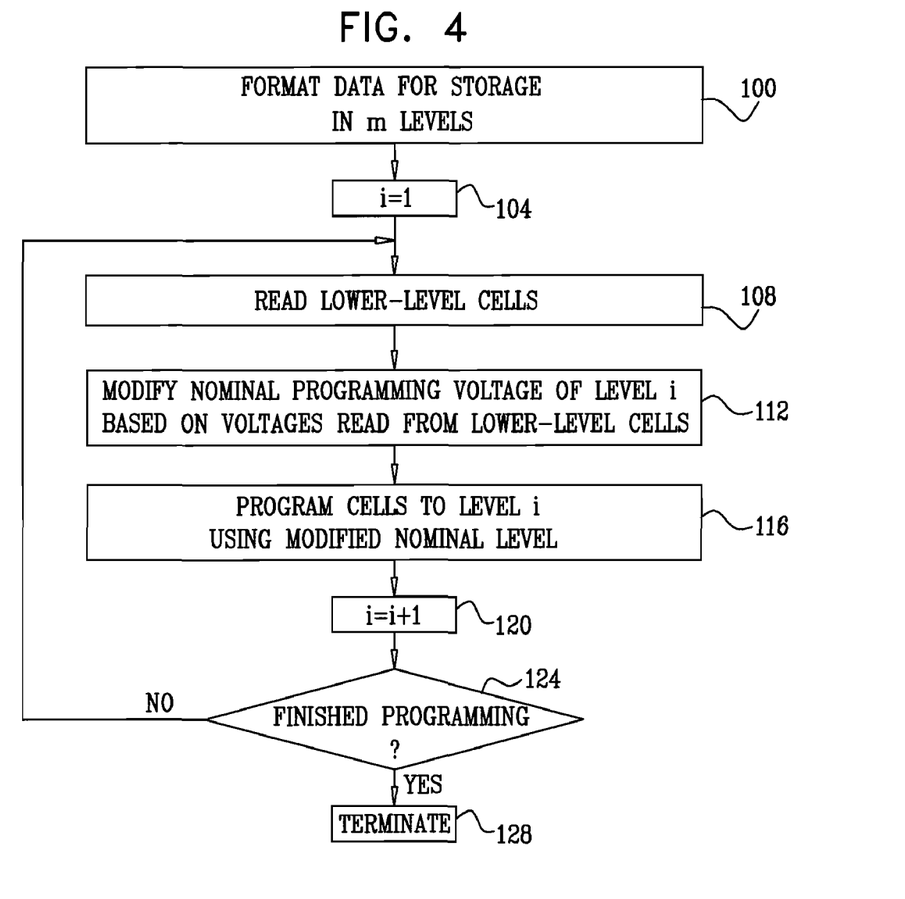
FIG. 4 is a flow chart that schematically illustrates a method for programming analog memory cells, in accordance with an embodiment of the present invention.

FIG. 4 is a flow chart that schematically illustrates a method for programming analog memory cells, in accordance with an embodiment of the present invention. The method begins with MSP 52 formatting data for storage in analog memory cells 32 or array 28, at a formatting step 100. The MSP maps data bits (or groups of data bits) to programming values. Each programming value is selected from a set of nominal values. In the present example, the MSP uses levels $L1 \ldots Lm$ for programming, and level $L0$ denotes erased cells. The MSP initializes a level index denoted i and sets i=1, so as to begin with the lowest programming level $L1$, at an initialization step 104.

The MSP reads a group of analog memory cells, which were previously programmed to levels that are lower than i, at a reading step 104. The group may comprise cells that are programmed to the next-lower level in comparison to i, or cells belonging to multiple lower levels. The group may comprise all the cells in the array that are programmed to the desired level or levels, or only a subset of the cells (e.g., the cells in a certain page or block, or only a sufficient number of cells for providing an adequate statistical sample size). In the first iteration (i=1), the lower level comprises i=0, i.e., the erased cells.

The MSP modifies the nominal value that corresponds to level $Li$ based on the read lower-level analog values, at a nominal value modification step 112. Typically, the MSP calculates a statistical characteristic of the analog values read from the lower-level cells, as described above. The MSP then modifies or calculates the nominal value of level $Li$ based on the statistical characteristic. The MSP then programs the memory cells that are intended to be programmed to level $Li$, at a programming step 116. The MSP programs the cells using the nominal value of level $Li$ calculated at step 112 above. For example, the MSP may apply a conventional P&V process, in which the target programming threshold is derived from the nominal value.

The MSP increments the level index, at an incrementing step 120. The MSP checks whether programming is completed, at a checking step 124. If programming is completed, the method terminates, at a termination step 128. Otherwise, the method loops back to step 108 above, and the MSP determines the nominal value of the next level.

As noted above, some or all of the MSP functionality may be implemented using circuitry that is internal to the memory device. In particular, measuring the statistical characteristic typically involves a large number of read operations and/or high-resolution reading of memory cells. As such, it may be advantageous to implement these operations internally to the memory device.

In some embodiments, the MSP divides the analog memory cells into multiple subsets having similar statistical characteristics, and calculates the nominal values separately within each subset. The subsets are also referred to herein as classes. For example, the analog value statistics may be different in different columns (bit lines) of the array, e.g., in odd and even columns (often assigned to different pages), in different rows (word lines), in different erasure blocks, in different memory planes, in cells that are adjacent to the boundary of an erasure block vs. cells located in the interior of the block, and/or in any other suitable cell groups.

By calculating the nominal values separately within each subset, the MSP is able to better match the selected nominal values to the analog value statistics. For example, the odd-order bit lines of a certain memory array may be noisier than the even-order bit lines, such as due to noisy sense amplifiers or other bit line-related circuitry. In such a scenario, the MSP may calculate a certain set of widely-spaced nominal values for the cells along the odd bit lines, and a more compact set of nominal values for the even bit lines. Thus, the performance of the entire memory array need not be compromised by a subset of high-distortion cells.

In some embodiments, the MSP can draw the nominal values from a finite set of discrete values. Alternatively, the MSP may assign the nominal values any suitable magnitude.

In some embodiments, the MSP may store in array 28 information regarding the nominal values that were used for storage, so that this information can be used when retrieving the data. In these embodiments, the MSP may retrieve the stored data by (1) retrieving the information regarding the nominal values, (2) setting read thresholds based on the nominal values used in the programming process, and (3) reading the data using the appropriate read thresholds.

Alternatively, the MSP may estimate the appropriate read thresholds from the analog values stored in the cells without explicitly storing or retrieving information regarding the nominal values. Further alternatively, the MSP may initially set read thresholds that are based on stored information regarding the nominal values, and then refine or re-estimate the threshold values based on the read analog values or data. Re-estimation can be performed, for example, by averaging the analog values that are assumed to belong to a certain level. Certain aspects of threshold estimation are described, for example, in PCT Patent Application PCT/IL2007/001315, entitled "Reading Memory Cells using Multiple Thresholds," Filed Oct. 30, 2007, whose disclosure is incorporated herein by reference.

Although the embodiments described herein mainly address defect management in solid-state memory devices, the principles of the present invention can also be used for storing and retrieving data in Hard Disk Drives (HDD) and other data storage media and devices. Some aspects of modifying programmed values based on prior programming operations are also described in PCT Application PCT/IL2007/000575, entitled "Reducing Programming Error in Memory Devices," filed May 10, 2007, whose disclosure is incorporated herein by reference.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for storing data in a memory that includes a plurality of analog memory cells, comprising:
   mapping the data to programming values selected from a set of nominal programming values comprising at least a first nominal programming value and a second nominal programming value, which is higher than the first nominal programming value;
   storing a part of the data in the analog memory cells by programming at least a first group of the cells using the first nominal programming value;
   measuring a statistical characteristic of the first group of the cells after programming the first group of the cells using the first nominal programming value;
   modifying the second nominal programming value responsively to the statistical characteristic; and
   programming at least a second group of the cells using the modified second nominal programming value.

2. The method according to claim 1, wherein measuring the statistical characteristic comprises reading analog values from the first group of the cells, and processing the read analog values to produce the statistical characteristic.

3. The method according to claim 2, wherein the statistical characteristic comprises at least one characteristic type selected from a group of types consisting of a mean of a distribution of the read analog values, a variance of the distribution of the read analog values, a standard deviation of the distribution of the read analog values, a maximum of the read analog values and a $k^{th}$-largest value among the read analog values.

4. The method according to claim 2, wherein modifying the second nominal programming value comprises measuring a distance between at least one of the read analog values and the second nominal programming value, and calculating the modified second nominal programming value responsively to the distance.

5. The method according to claim 2, wherein modifying the second nominal programming value comprises increasing the second nominal programming value when the statistical characteristic indicates that the read analog values are widely-distributed around the first nominal programming value.

6. The method according to claim 2, wherein modifying the second nominal programming value comprises decreasing the second nominal programming value when the statistical characteristic indicates that the read analog values are closely concentrated around the first nominal programming value.

7. The method according to claim 1, and comprising, after programming the second group of the cells, reading the second group of the cells so as to reconstruct the data.

8. The method according to claim 7, wherein modifying the second nominal programming value comprises storing information regarding the modified second nominal programming value, and wherein reading the second group of the cells comprises retrieving the stored information regarding the modified second nominal programming value and reading the second group of the cells responsively to the retrieved information.

9. The method according to claim 1, wherein modifying the second nominal programming value comprises reading respective analog values from the cells in the second group and processing the read analog values to estimate the modified second nominal programming value.

10. The method according to claim 1, wherein measuring the statistical characteristic and modifying the second nominal programming value comprise classifying the analog memory cells to multiple classes, and measuring the statistical characteristic and modifying the second nominal programming value separately within each of the classes.

11. The method according to claim 10, wherein the classes comprise at least one class type selected from a group of types consisting of a row of the memory cells, a column of the memory cells, an odd-order column, an even-order column, a memory page, an erasure block, a memory plane, cells located near a boundary of a memory block and cells located in an interior of the memory block.

12. The method according to claim 1, and comprising designating an area of the memory as a calibration area, selecting the first group of the memory cells from the memory cells located in the calibration area, and selecting the second group of the memory cells from the memory cells located in another area of the memory different from the calibration area.

13. A data storage apparatus, comprising:
an interface, which communicates with a memory that includes a plurality of analog memory cells; and
a processor coupled to the interface, which maps data to programming values selected from a set of nominal programming values comprising at least a first nominal programming value and a second nominal programming value that is higher than the first nominal programming value, stores a part of the data in the analog memory cells by programming at least a first group of the cells using the first nominal programming value, measures a statistical characteristic of the first group of the cells after programming the first group of the cells using the first nominal programming value, modifies the second nominal programming value responsively to the statistical characteristic, and programs at least a second group of the cells using the modified second nominal programming value.

14. The apparatus according to claim 13, wherein the processor reads analog values from the first group of the cells, and processes the read analog values to produce the statistical characteristic.

15. The apparatus according to claim 14, wherein the statistical characteristic comprises at least one characteristic type selected from a group of types consisting of a mean of a distribution of the read analog values, a variance of the distribution of the read analog values, a standard deviation of the distribution of the read analog values, a maximum of the read analog values and a $k^{th}$-largest value among the read analog values.

16. The apparatus according to claim 14, wherein the processor measures a distance between at least one of the read analog values and the second nominal programming value, and calculates the modified second nominal programming value responsively to the distance.

17. The apparatus according to claim 14, wherein the processor increases the second nominal programming value when the statistical characteristic indicates that the read analog values are widely-distributed around the first nominal programming value.

18. The apparatus according to claim 14, wherein the processor decreases the second nominal programming value when the statistical characteristic indicates that the read analog values are closely concentrated around the first nominal programming value.

19. The apparatus according to claim 13, wherein the processor reads the second group of the cells after programming the second group of the cells, so as to reconstruct the data.

20. The apparatus according to claim 19, wherein the processor stores information regarding the modified second nominal programming value, and reads the second group of the cells by retrieving the stored information regarding the modified second nominal programming value and reading the second group of the cells responsively to the retrieved information.

21. The apparatus according to claim 13, wherein the processor reads respective analog values from the cells in the second group and processes the read analog values to estimate the modified second nominal programming value.

22. The apparatus according to claim 13, wherein the processor classifies the analog memory cells to multiple classes, and measures the statistical characteristic and modify the second nominal programming value separately within each of the classes.

23. The apparatus according to claim 22, wherein the classes comprise at least one class type selected from a group of types consisting of a row of the memory cells, a column of the memory cells, an odd-order column, an even-order column, a memory page, an erasure block, a memory plane, cells located near a boundary of a memory block and cells located in an interior of the memory block.

24. The apparatus according to claim 13, wherein the processor designates an area of the memory as a calibration area, selects the first group of the memory cells from the memory cells located in the calibration area, and selects the second group of the memory cells from the memory cells located in another area of the memory different from the calibration area.

25. A data storage apparatus, comprising:
a memory, which comprises a plurality of analog memory cells; and
a processor, which is connected to the memory and maps data to programming values selected from a set of nominal programming values comprising at least a first nominal programming value and a second nominal programming value that is higher than the first nominal programming value, stores a part of the data in the analog memory cells by programming at least a first group of the cells using the first nominal programming value, measures a statistical characteristic of the first group of the cells after programming the first group of the cells using the first nominal programming value, modifies the second nominal programming value responsively to the statistical characteristic, and programs at least a second group of the cells using the modified second nominal programming value.

* * * * *